US007930657B2

(12) United States Patent
Stanton et al.

(10) Patent No.: US 7,930,657 B2
(45) Date of Patent: Apr. 19, 2011

(54) METHODS OF FORMING PHOTOMASKS

(75) Inventors: William Stanton, Boise, ID (US); Fei Wang, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 681 days.

(21) Appl. No.: 12/018,612

(22) Filed: Jan. 23, 2008

(65) Prior Publication Data

US 2009/0186283 A1 Jul. 23, 2009

(51) Int. Cl.
*G06F 17/50* (2006.01)

(52) U.S. Cl. .......................................... 716/54; 716/55
(58) Field of Classification Search ........................ None
See application file for complete search history.

(56) References Cited

U.S. PATENT DOCUMENTS

| | | | |
|---|---|---|---|
| 5,804,336 A | 9/1998 | Rolfson | |
| 5,942,355 A | 8/1999 | Brainerd et al. | |
| 6,157,426 A * | 12/2000 | Gu | 349/111 |
| 6,183,915 B1 | 2/2001 | Rolfson | |
| 6,218,292 B1 * | 4/2001 | Foote | 438/636 |
| 6,226,782 B1 * | 5/2001 | Nowak et al. | 716/19 |
| 6,355,382 B1 | 3/2002 | Yasuzato et al. | |
| 6,381,072 B1 | 4/2002 | Burger | |
| 6,395,432 B1 | 5/2002 | Rolfson | |
| 6,599,666 B2 | 7/2003 | Rolfson | |
| 6,611,090 B1 * | 8/2003 | Ishikawa et al. | 313/461 |
| 6,669,996 B2 * | 12/2003 | Ueno et al. | 427/571 |
| 6,696,224 B2 | 2/2004 | Rolfson | |
| 6,724,968 B2 | 4/2004 | Lackritz et al. | |
| 6,841,310 B2 | 1/2005 | Dulman | |
| 6,883,159 B2 * | 4/2005 | Schenker et al. | 716/21 |
| 6,908,715 B2 | 6/2005 | Rolfson | |
| 7,022,438 B2 | 4/2006 | Kim | |
| 7,070,657 B1 * | 7/2006 | Cheung et al. | 118/715 |
| 7,116,411 B2 | 10/2006 | Park et al. | |
| 7,231,629 B2 | 6/2007 | Laidig | |
| 7,242,459 B2 | 7/2007 | Shi et al. | |
| 7,247,574 B2 | 7/2007 | Broeke et al. | |
| 7,274,440 B1 * | 9/2007 | Janik et al. | 356/34 |
| 7,321,467 B2 * | 1/2008 | Huang | 359/586 |

(Continued)

FOREIGN PATENT DOCUMENTS

WO    WO 03/081339 A2    10/2003

OTHER PUBLICATIONS

Montecchi et al., "Thickness and model optimization in characterization of optical interference films by using discontinuities of n(lambda) solutions," Pure Appl. Opt. 4 (1995), pp. 15-26.*

(Continued)

*Primary Examiner* — Leigh Marie Garbowski
(74) *Attorney, Agent, or Firm* — Wells St. John P.S.

(57) ABSTRACT

Some embodiments include methods in which a mathematical representation of a photomask construction is defined, with such representation comprising a plurality of pillars that individually contain a plurality of distinct layers. Each of the layers has two or more characteristic parameters which are optimized through an optimization loop. Subsequently, specifications obtained from the optimization loop are utilized to form actual layers over an actual reticle base. Some embodiments include photomask constructions in which a radiation-patterning topography is across a reticle base, with such topography including multiple pillars that individually contain at least seven distinct layers.

12 Claims, 5 Drawing Sheets

U.S. PATENT DOCUMENTS

| | | | |
|---|---|---|---|
| 7,455,937 B2 * | 11/2008 | Rolfson | 430/5 |
| 7,477,385 B2 * | 1/2009 | Lotz et al. | 356/364 |
| 7,480,891 B2 * | 1/2009 | Sezginer | 716/21 |
| 7,483,155 B2 * | 1/2009 | Hayasaki et al. | 356/625 |
| 7,506,300 B2 * | 3/2009 | Sezginer et al. | 716/19 |
| 7,515,253 B2 * | 4/2009 | Bareket et al. | 356/73 |
| 7,519,940 B2 * | 4/2009 | Huang et al. | 716/21 |
| 7,568,174 B2 * | 7/2009 | Sezginer et al. | 716/4 |
| 7,709,160 B2 * | 5/2010 | Yoshizawa et al. | 430/5 |
| 7,781,349 B2 * | 8/2010 | Op de Beeck | 438/761 |
| 2006/0099517 A1 * | 5/2006 | Sugawara | 430/5 |
| 2006/0121361 A1 | 6/2006 | Rolfson | |
| 2007/0178392 A1 | 8/2007 | Yoshizawa | |
| 2009/0078316 A1 * | 3/2009 | Khazeni et al. | 136/257 |

OTHER PUBLICATIONS

Ruiz-Urbieta et al., "Refractive Index, Thickness, and Extinction Coefficient of Slightly Absorbing Thin Films," Journal of the Optical Society of America, vol. 62, No. 8, Aug. 1972, pp. 931-937.*

Yamamoto, Norihiro et al. "Mask Topography Effect with Polarization Hyper NA" Proc. of SPIE vol. 6154 pp. 61544F-1 through 61544F9, 2006, 9 pages.

* cited by examiner

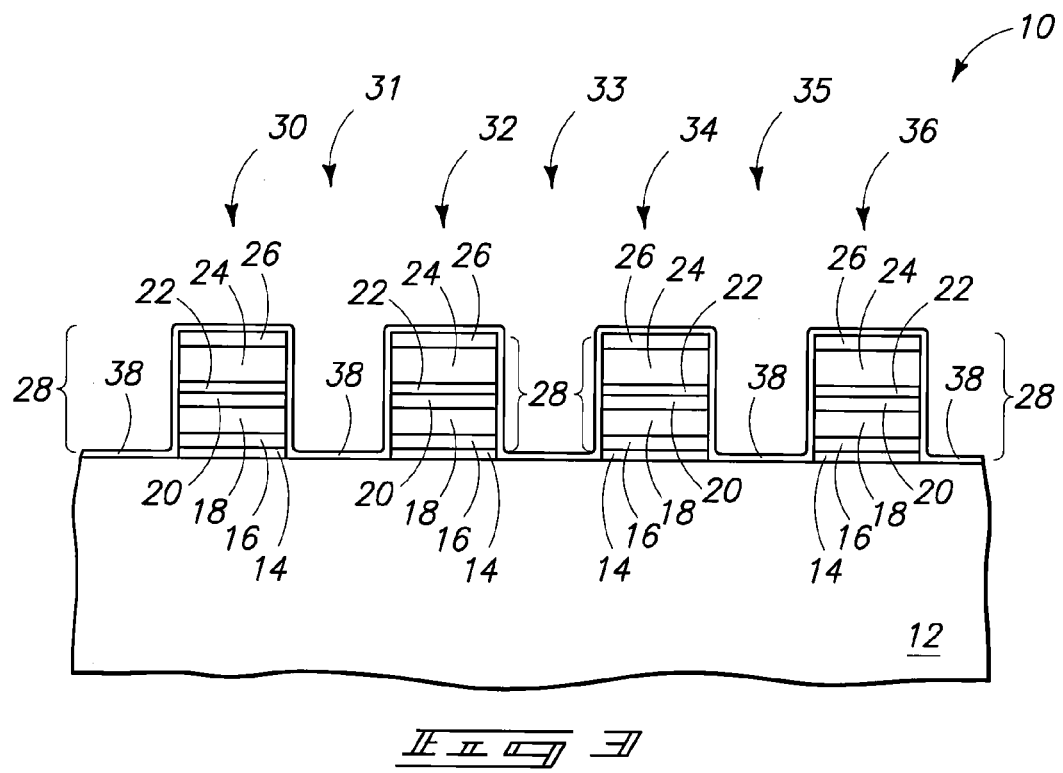
$\fbox{$F\,I\,G$}\ \ 3$
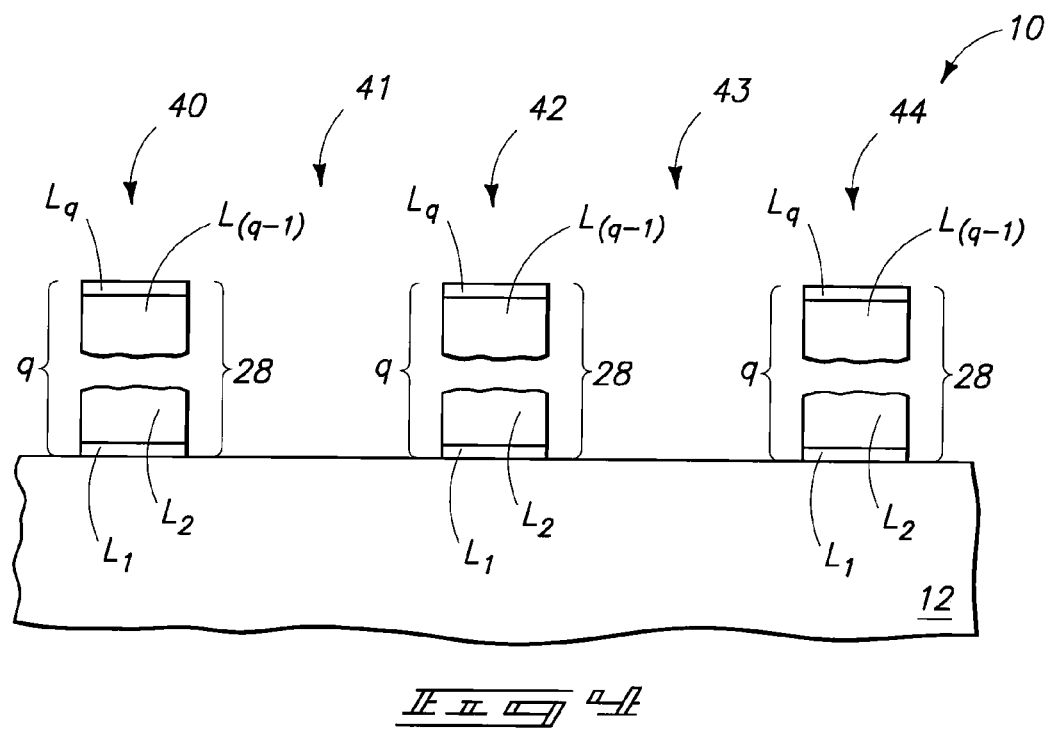
$\fbox{$F\,I\,G$}\ \ 4$

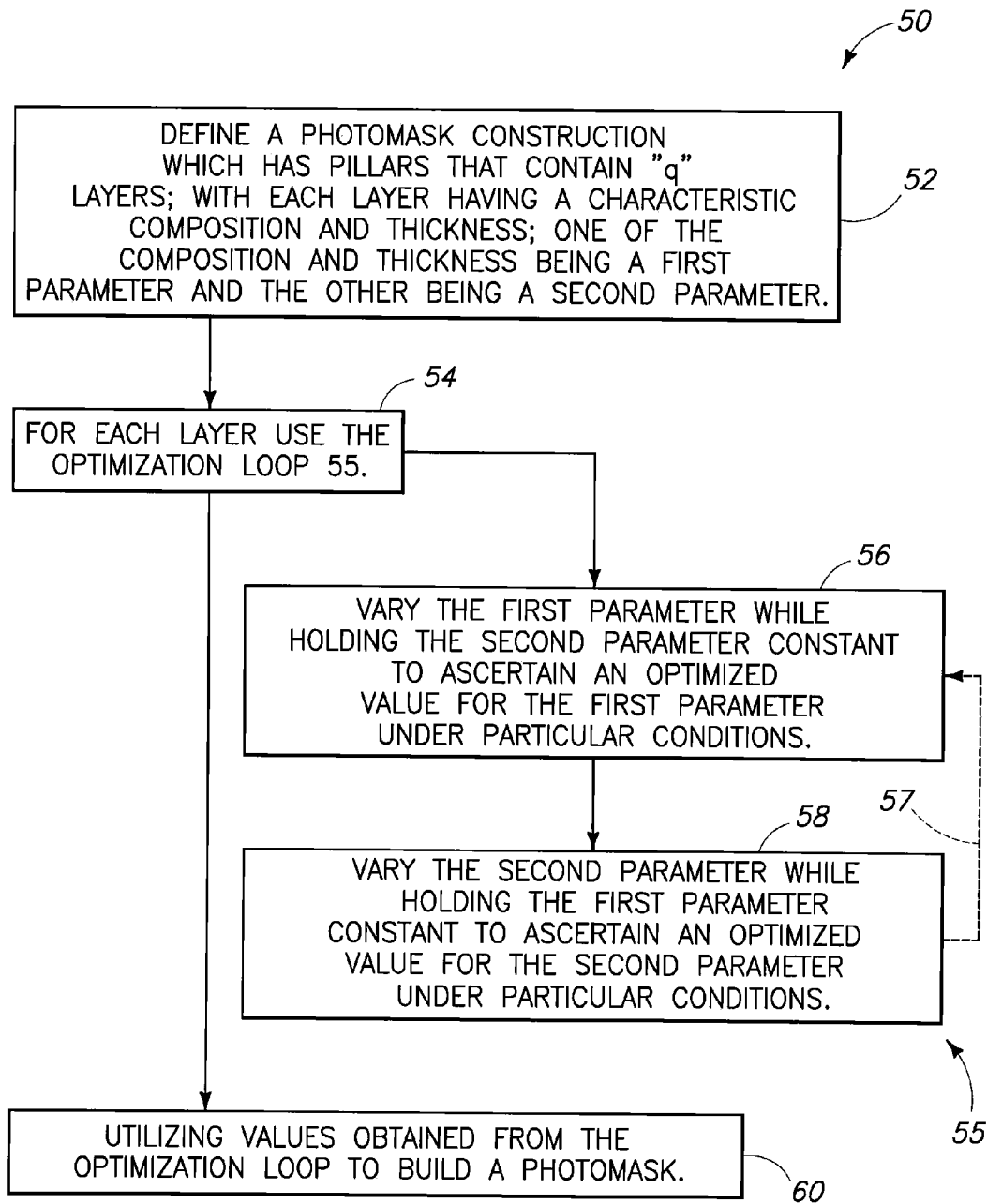

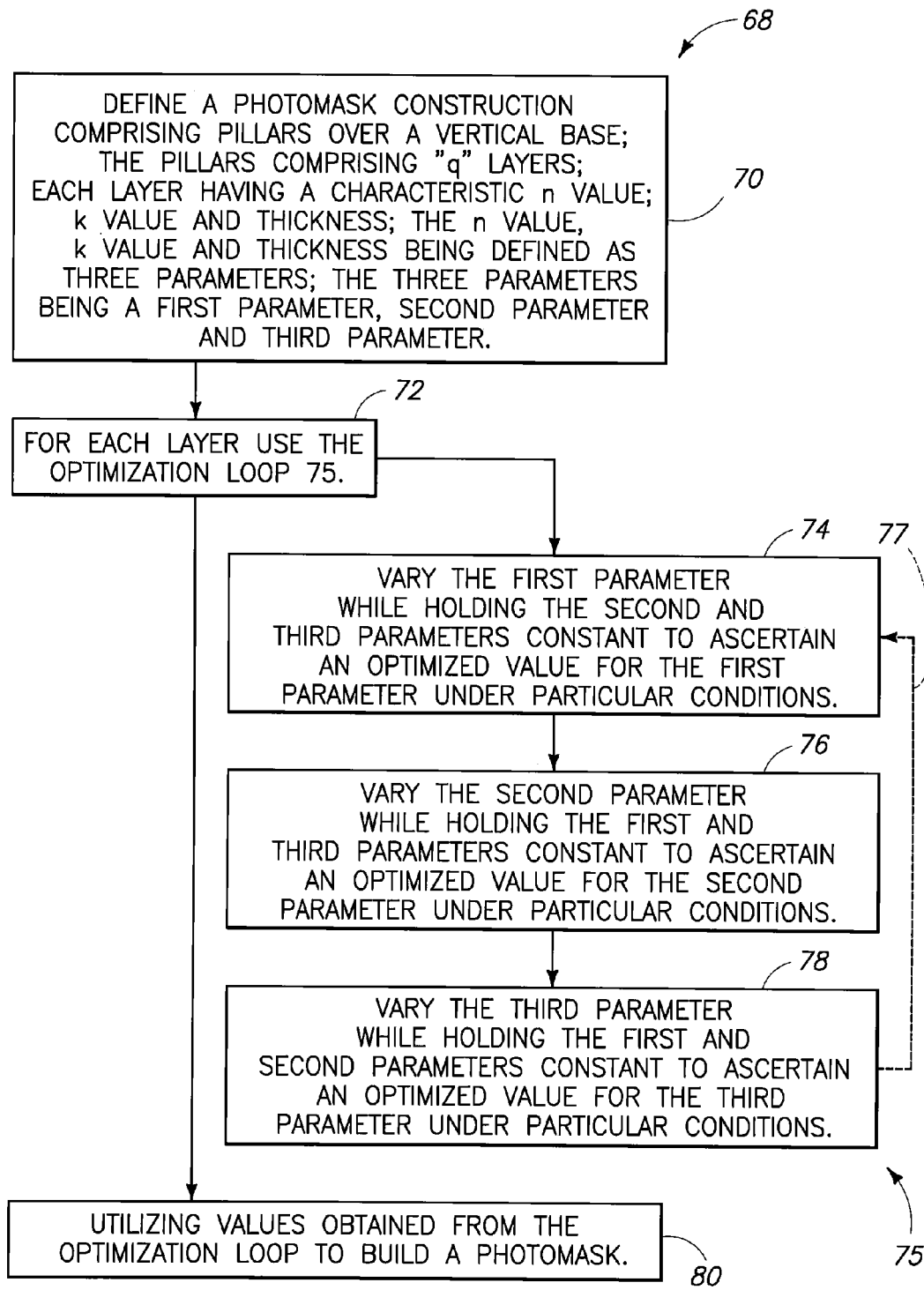

METHODS OF FORMING PHOTOMASKS

TECHNICAL FIELD

Photomasks and methods of forming photomasks.

BACKGROUND

Integrated circuitry fabrication may involve lithographic processing to transfer patterns formed in an imaging layer to underlying substrate material which will form part of the finished circuitry. For example, an imaging layer such as photoresist is provided over a layer to be patterned by etching. The imaging layer is then photolithographically processed such that selected regions of the imaging layer are exposed to suitable conditions which impact the solvent solubility of the exposed regions versus the unexposed regions.

The photolithographic processing may comprise subjecting the imaging layer to actinic energy passed through a mask pattern. The mask pattern has windows therethrough. Some regions of the imaging layer are exposed to the actinic energy passed through the windows, and other regions of the imaging layer are shadowed by non-windowed regions of the mask so that such other regions are not exposed to the actinic radiation (or at least are exposed to less actinic energy than the fully exposed regions). The imaging layer is then solvent processed to remove one or the other of the exposed or the unexposed regions, thereby forming the imaging layer to have mask openings extending partially or wholly therethrough to the underlying layer being patterned. In one type of processing, the substrate is then subjected to a suitable etching chemistry which is selected to etch the underlying layer or layers at least at a greater degree than the imaging layer, thereby transferring the imaging pattern to the underlying circuitry layer or layers. Alternate to etching, the substrate may be ion implanted or otherwise processed through the mask openings in the imaging layer.

In the past, some types of photolithographic patterning tools have been referred to as photomasks, and others have been referred to as reticles. The term "photomask" has been used to refer to tools which define a pattern for an entirety of a wafer, and the term "reticle" has been used to refer to tools which define a pattern for only a portion of a wafer. However, the terms "photomask" (or more generally "mask") and "reticle" are frequently used interchangeably in modern parlance, so that either term can refer to a radiation-patterning tool that encompasses either a portion or an entirety of a wafer. For purposes of interpreting this disclosure and the claims that follow, the terms "reticle" and "photomask" are utilized interchangeably to refer to radiation-patterning tools that encompass either a portion of a wafer or an entirety of a wafer.

Various types of photomasks are known in the art. For example, one type of mask includes a transparent plate covered with regions of a radiation blocking material, such as chromium, which is used to define the semiconductor feature pattern to be projected by the mask. Such masks are called binary masks, since radiation is completely blocked by the radiation blocking material and fully transmitted through the transparent plate in areas not covered by the radiation blocking material. Accordingly, such use binary features within the mask patterning area which include an opaque layer to essentially completely block the transmission of the actinic energy.

Due in part to limitations imposed by the wavelength of light or other actinic energy used to transfer the pattern, resolution can degrade at the edges of the patterns of binary photomasks. Such has led to the development of phase-shifting photomasks which can increase the resolution of patterns by creating phase-shifting regions in transparent areas of the photomask. Standard phase-shifting photomasks are generally formed in one of two manners. In a first, transparent films of appropriate thickness are deposited and patterned over the desired transparent areas using a second level lithography and etch technique. In a second, vertical trenches are etched into a transparent substrate. In both instances, the edges between the phase-shifted and unshifted regions generally result in a transition between high and low refractive index regions. These types of masks include transmission areas on either side of a patterned opaque feature. One of these transmission areas transmits light 180° out of phase from the other transmission areas, and both sides transmit approximately 100% of the incident radiation. Light diffracted underneath the opaque regions from the phase-shifted regions thus cancels each other, thereby creating a null or "dark area".

Another type of phase-shifting mask is known as an "attenuated" or "half-tone" phase shift mask. Such masks include both transparent and less transmissive regions. Actinic energy/radiation passing through a partially transmissive region of such a mask generally lacks the energy to substantially affect a resist layer exposed by the mask. Moreover, the partially transmissive regions of such masks are designed to shift passing radiation 180° relative to the radiation passing through the completely transmissive regions and, as a consequence, the radiation passing through the partially transmissive regions destructively interferes with radiation diffracting out from the edges of the completely transmissive regions. Masks have been proposed that use both binary features and attenuating phase-shift mask features in the device area.

As minimum device pitch falls below 100 nanometers (i.e., where minimum feature size or minimum critical dimension falls below 50 nanometers), attenuated phase-shift photomasks may begin to loose contrast with specific wavelengths of actinic energy.

BRIEF DESCRIPTION OF THE DRAWINGS

FIG. 3 is a diagrammatic cross-sectional view of a portion of another example embodiment photomask.

FIG. 4 is a diagrammatic cross-sectional view of a portion of another example embodiment photomask.

FIG. 5 shows a flow chart describing an example process embodiment.

FIG. 6 shows a flow chart describing another example process embodiment.

DETAILED DESCRIPTION OF THE ILLUSTRATED EMBODIMENTS

Some embodiments encompass photomasks used to fabricate integrated circuitry. In the context of this document, a "finished-construction" photomask is a mask which has been fabricated to completion whereby no additional layer(s)/material(s) will be deposited or removed relative to the substrate, with such being in a completed construction to be ready for use as a photomask in the fabrication of integrated circuitry. Accordingly, a "finished-construction" mask does not encompass any intermediate structure of a photomask that has not been fabricated to completion. However, some embodiments may also encompass intermediate construction photomasks, in other words those which are not of a finished-construction.

The two common types of photomasks, binary and phase shifting, each have advantages and disadvantages. Binary masks are relatively simple to fabricate and inspect, but often have less imaging contrast and process margin than phase shifting masks due to the lack of constructive imaging in the binary mask as a result of the absence of phase shifter. However, as features shrink, binary masks outperform phase shifting masks to yield better imaging contrast under some illumination conditions (for instance, polarized off-axis illuminations, and super-high numerical aperture). Some embodiments disclosed herein recognize that advantages in contrast may be enhanced by utilizing stacks of thin films as patterning features of a photomask, with each film optimized in terms of composition and thickness. More specifically, the stacks may be optimized both materially and structurally to have improved imaging contrast relative to conventional photomask features. A simulation has shown that molybdenum/silicon multi-film stacks (1400 angstroms total thickness; utilizing about 40 silicon films alternately spaced with about 40 molybdenum films) may exhibit larger imaging contrast for 45 nanometer and 40 nanometer half-pitch features than conventional binary and phase-shifting masks.

Example embodiments are described with reference to FIGS. 1-7.

Figure 1:
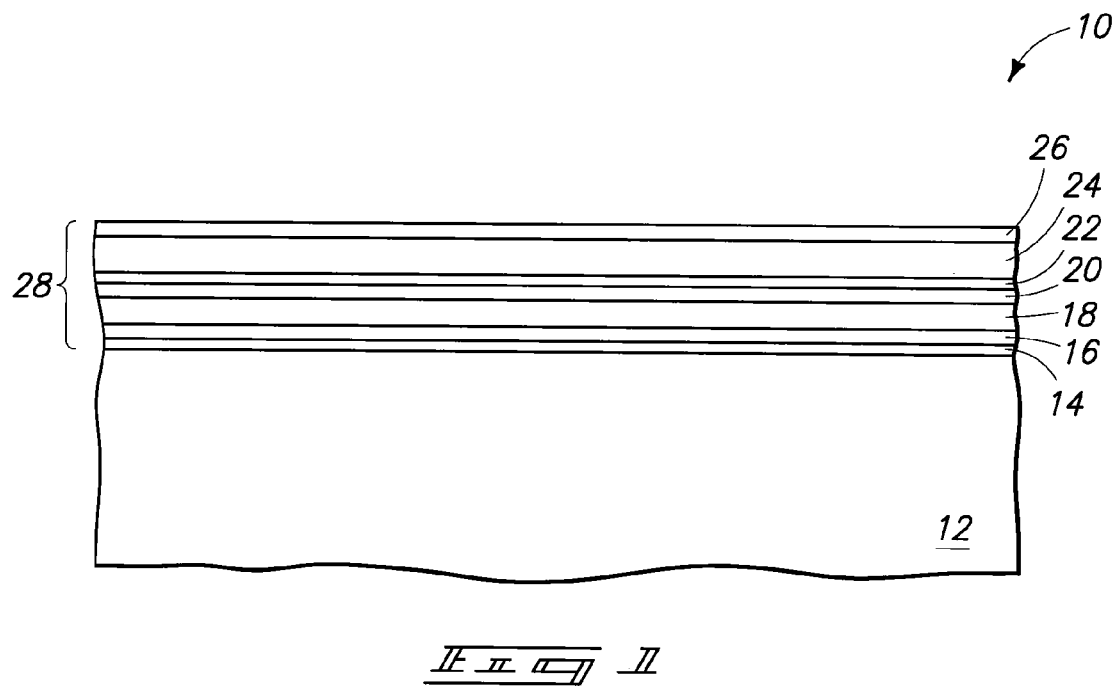
FIGS. 1 and 2 are diagrammatic cross-sectional views of a portion of a photomask illustrating an example embodiment method for forming an example embodiment photomask.

Referring to FIG. 1, a portion of a construction 10 is illustrated at an intermediate processing stage during fabrication of a photomask. Construction 10 comprises a reticle base 12 and multiple layers (or films) 14, 16, 18, 20, 22, 24 and 26 over the reticle base. The layers form a stack 28 over the reticle base.

The construction 10 will ultimately be formed into a finished photomask, and will be utilized for patterning specific wavelengths of radiation. The reticle base 12 comprises a composition at least partially transparent to the specific wavelengths of radiation that are to be patterned with the photomask. In example embodiments, the reticle base may comprise, consist essentially of, or consist of quartz.

Each of the layers 14, 16, 18, 20, 22, 24 and 26 comprises a composition at least partially transparent to the specific wavelengths of radiation that are ultimately to be patterned with the photomask. Each of the layers comprises a single composition; and may be characterized by an n value corresponding to a refractive index of the composition, and a k value corresponding to an extinction coefficient of the composition. Each of the layers may further be characterized by a thickness of the layer. The three parameters of refractive index (n value), extinction coefficient (k value) and thickness may be referred to as first, second and third parameters. One of the three parameters of refractive index, extinction coefficient and thickness will be the first parameter, one will be the second parameter, and one will be the third parameter; but the particular correspondence of which is the first, second and third parameter will vary amongst different embodiments, as will be discussed below with reference to FIG. 6.

The layers 14, 16, 18, 20, 22, 24 and 26 are distinct from one another, and accordingly no layer comprises an identical composition to an immediately adjacent layer. However, two or more of the layers may comprise the same composition as one another provided that they are not immediately adjacent one another. The layers may comprise any suitable compositions; and may comprise one or both of materials which are phase shifting, and materials which are not phase shifting. In an example embodiment, the layers alternate between silicon and molybdenum within the stack. For instance, layers 14, 18, 22 and 26 may consist of silicon, and layers 16, 20 and 24 may consist of molybdenum.

The interfaces between the layers 14, 16, 18, 20, 22, 24 and 26 are shown as being clean boundaries. However, in some embodiments the materials of adjacent layers may interact with one another to form thin films at the interfaces. For instance, interfaces between silicon and molybdenum may comprise molybdenum silicide resulting from interaction of the molybdenum and silicon. A stack 28 comprising two alternating compositions may be referred to as "primarily" comprising two distinct materials to indicate that the stack may comprise thin films of by-product at interfaces of the two main materials utilized in the stack. For instance, if layers 14, 16, 18, 20, 22, 24 and 26 alternate between molybdenum and silicon, the stack 28 may be considered to primarily comprise the two distinct materials of molybdenum and silicon regardless of whether there are thin films of molybdenum silicide formed at interfaces of adjacent layers. In contrast, if the stack 28 is referred to as consisting of two distinct materials, such precludes any other materials from being in the stack besides the two recited materials.

Materials suitable for inclusion within stack 28 are any materials that are at least partially transparent to the wavelengths of radiation that are to be patterned with the finished photomask formed from construction 10. For example the materials within stack 28 may include one or more of silicon, silicon dioxide, silicon nitride, tantalum nitride, molybdenum sulfide, $MoSi_x$, $MoSi_xO_y$, $MoSi_xO_yN_z$, $Ta_xHf_y$, $Ta_xN_y$, and $Si_xO_xN_y$, where "x", "y", and "z" are greater than zero. Example thicknesses for layers 14, 16, 18, 20, 22, 24 and 26 are from about 10 Angstroms to about 2,000 Angstroms.

Although stack 28 is shown comprising seven layers, in other embodiments the stack may comprise different numbers of layers. In some embodiments, the stack may comprise at least three layers, at least seven layers, at least 20 layers, at least 40 layers, at least 80 layers, etc. In an example embodiment, the stack may comprise at least 80 distinct layers, with such layers primarily comprising alternating molybdenum and silicon.

Figure 2:
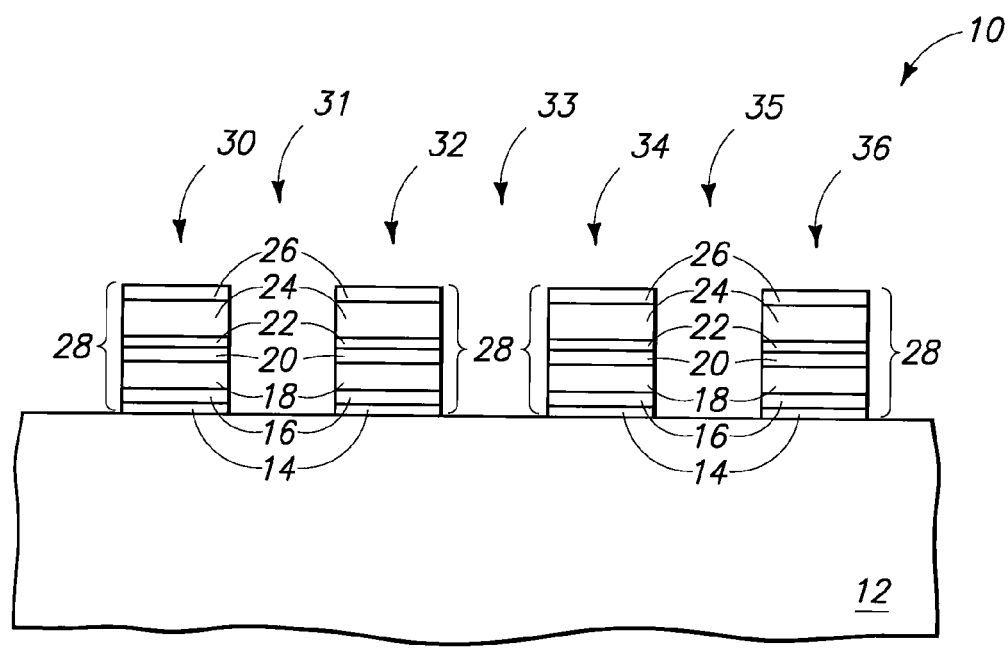

Referring to FIG. 2, stack 28 is patterned into a plurality of pillars 30, 32, 34 and 36 which are spaced from one another by gaps 31, 33 and 35. The patterning of stack 28 into the pillars can be accomplished with any suitable processing including, for example, photolithographic patterning. Specifically, a photosensitive material (not shown) may be provided over top layer 26 and patterned with e-beam or laser technologies, the pattern transferred to the layers of stack 28 with one or more suitable etches, and the photosensitive material than removed to leave the construction of FIG. 2.

In some embodiments, the construction 10 of FIG. 2 may correspond to a finished photomask construction. Such construction can be considered to comprise a radiation-patterning topography across the reticle base 12, with such topography containing the pillars 30, 32, 34 and 36, and the gaps between and adjacent the pillars. In other embodiments, the construction of FIG. 2 may be subjected to additional processing to form a finished photomask structure. For instance, FIG. 3 shows a layer 38 formed across pillars 30, 32, 34 and 36, as well as across the gaps between the pillars.

Layer 38 may comprise any suitable composition, and may, for example, comprise $SiO_2$, $Si_3N_4$, $SrF_2$, $MgF_2$, $Al_2O_3$, $BaF_2$, Al, TiN, Cu, Cr, Si, and mixtures thereof. Layer 38 may be formed to a thickness of, for example, from about five angstroms to about 50 angstroms.

Layer 38 may assist in improving contrast formed by reticle construction 10 in that the layer has a variable thickness relative to incident actinic energy directed orthogonally to base 12 (i.e. directed through base 12 from the illustrated bottom toward the illustrated top). Specifically, layer 38 is vertically thicker in regions along the vertical sidewall surfaces of the pillars than in regions extending along the horizontal surface of base 12 between the pillars.

Layer 38 may be considered to form liners along sidewalls of the pillars 30, 32, 34 and 36; with such liners narrowing the gaps 31, 33 and 35 between the pillars, but not eliminating such gaps. Although the liners along the sidewalls of the pillars are shown to comprise only a single layer 38, in other embodiments the liners may comprise multiple layers.

The embodiments of FIGS. 1-3 are illustrated as comprising a stack 28 containing seven distinct layers. FIG. 4 more generically illustrates an example reticle construction. In referring to FIG. 4, similar numbering will be used as is utilized above in describing FIGS. 1-3, where appropriate.

FIG. 4 shows construction 10 comprising a plurality of pillars 40, 42 and 44 supported by a reticle base 12; with the pillars being separated from one another by gaps 41 and 43. Each of the pillars comprises a multilayer stack 28. The multilayer stacks each comprise "q" layers extending from a bottom layer $L_1$ to a top layer $L_q$, (with the shown stacks comprising layers $L_1, L_2, \ldots L_{(q-1)}$ and $L_q$). The number of layers, "q", may be any suitable integer; and may be, for example, at least two layers, at least three layers, at least seven layers, at least 20 layers, at least 40 layers, or at least 80 layers, in some example embodiments.

Each of the layers $L_1 \ldots L_q$ may be optimized relative to the refractive index (n value), extinction coefficient (k value) and thickness in order to obtain maximum imaging contrast between radiation passing through the pillars and radiation passing through the gaps between the pillars. Since the refractive index and the extinction coefficient may be dictated by a choice of material, an alternative optimization may be to optimize the composition and thickness of each of the layers. Either mode of optimization may also include optimization of the number of layers utilized in the stack 28. In the shown embodiment, all of the stacks comprise the same number of layers and the same compositions of layers. In other embodiments, some of the stacks may comprise different numbers of layers, and/or different compositions of layers, relative to others of the stacks.

Any suitable method may be utilized to determine optimization of various parameters of layers of stacks 28 (with example parameters being the number of the layers, thicknesses of the layers, extinction coefficients of the layers and refractive indices of the layers). An example method is to utilize normalized image log slope (NILS) in combination with an optimization sequence that sequentially varies various parameters of the stacks to optimize the parameters. This method may be incorporated into computer readable code that can enable a computer to determine optimization of the various parameters the stacks. The code may be, for example, on a computer readable media, in a carrier wave, or hardwired into a processor. Examples of computer readable media are floppy disks, storage tapes, hard drives, RAM and ROM. Examples of carrier waves are internet communications.

Example methods for incorporating algorithmic optimization of various parameters of the layers $L_1$ to $L_q$ of stacks 28 into reticle fabrication are described with reference to FIGS. 5 and 6.

FIG. 5 shows a flow chart diagram 50 describing some steps that may be utilized for incorporating algorithmic optimization of various parameters of the layers of stacks 28 into a reticle fabrication process.

An initial step 52 comprises defining a photomask construction which has pillars that contain layers (with the initial number of layers being "q"). The photomask construction defined at step 52 is a mathematical model of a photomask construction, and is utilized for a subsequent algorithmic optimization loop. Accordingly, the photomask construction defined at step 52 may be considered to exist in a modeling domain, as opposed to the real domain where an actual photomask would exist. Ultimately, information obtained from the modeling domain is shifted to the real domain to form an actual photomask, as will be discussed below with reference to step 60.

Referring still to step 52, each of the layers of the photomask construction of step 52 is defined to have a characteristic composition and thickness, with the compositions and thicknesses of the layers at step 52 being starting points for a subsequent optimization loop. The composition and thickness of each layer may be considered to correspond to first and second parameters of the individual layers. The first and second parameters are sequentially optimized in a subsequent optimization loop. In some embodiments, the composition is the first parameter while the thickness is the second parameter; and in other embodiments the thickness is the first parameter while the composition is the second parameter. The composition dictates extinction coefficient and refractive index of a material, and accordingly the present embodiment simultaneously alters extinction coefficient and refractive index by shuffling through multiple compositions. Another method (discussed below with reference to FIG. 6) treats extinction coefficient and refractive index separately, rather than shuffling through discrete compositions.

Referring next to step 54, each layer is subjected to an optimization loop 55 which includes steps 56 and 58. The optimization loop is performed on the mathematical construct of the photomask in the modeling domain. Step 56 of the optimization loop varies the first parameter while holding the second parameter constant to ascertain an optimized value for the first parameter under particular conditions (with such conditions including the number of layers set at step 52, and the value of the second parameter utilized at step 56); and step 58 of the optimization loop varies the second parameter while holding the first parameter constant (at the optimized value obtained from step 56) to ascertain an optimized value for the first parameter under particular conditions (with such conditions including the number of layers set at step 52, and the value of the first parameter utilized at step 58).

The optimizations of the first and second parameters may be tied to one another (in other words, the optimization of the first parameter may not be entirely independent of the optimization of the second parameter), and accordingly steps 56 and 58 may be repeated multiple times (as indicated by dashed-line 57) until a stable result is obtained for the optimized values of the first and second parameters.

The optimization of a parameter involves comparison of the maximum imaging contrast obtained utilizing one value of the parameter relative to another value of the parameter, and may utilize NILS for the comparison.

Each of the layers is independently optimized for composition and thickness as the layers are subjected to the optimization loop. However, the results obtained for a subsequent layer may impact the optimization of an earlier layer. Accordingly, it may be desired to cycle the various layers multiple times through the optimization loops until stable results are reached for all of the layers.

The number of layers may affect the contrast obtained for a photomask, and accordingly the number of layers may be varied as part of the optimization loop. Thus, in some embodiments the number of layers may remain at a pre-defined value ("q") after utilization of the optimization loop, while in other embodiments the number of layers may be varied as part of the optimization loop so that the final number of layers output from the optimization loop may be other than the initial value "q".

The optimization loop creates a dataset which is subsequently translated into a pattern formed on a real photomask. The process of translating the dataset into a pattern on a real photomask is referred to as taping the pattern onto the photomask. In such context, the terms "tape" and "tape out" refer to a process of transferring the dataset to appropriate hardware which writes a pattern represented by the dataset onto the photomask. The process of writing onto the photomask may be accomplished by, for example, laser writing and/or electron-beam writing methodologies. The step of taping the pattern onto the photomask is represented by step 60, which describes utilizing the values obtained from the optimization loop to build an actual (i.e., real) photomask.

Referring to FIG. 6, such shows a flow chart diagram 68 of another method for utilizing an optimization loop to create a dataset for a photomask. The process of FIG. 6 is similar to that discussed above with reference to FIG. 5, but independently varies extinction coefficient (k value) and refractive index (n value), rather than varying compositions.

An initial step 70 of FIG. 6 is to define a photomask construction comprising pillars over a reticle base. Such defined photomask construction is a mathematical construct in the modeling domain. The defined construction has pillars comprising layers, with each layer having a characteristic n value, k value and thickness. The n value, k value and thickness may be considered three parameters; with such parameters being a first parameter, second parameter and third parameter. The first, second and third parameters are sequentially optimized in a subsequent optimization loop. In some embodiments, the n value is the first parameter, in other embodiments the k value is the first parameter, and in yet other embodiments the thickness is the first parameter.

Referring next to step 72, each layer is subjected to an optimization loop 75 which includes steps 74, 76 and 78. The optimization loop occurs on the mathematical construct of the photomask in the modeling domain.

Step 74 of the optimization loop varies the first parameter while holding the second and third parameters constant to ascertain an optimized value for the first parameter under particular conditions (with such conditions including the number of layers set at step 70, and the values of the second and third parameters utilized at step 74).

Step 76 of the optimization loop varies the second parameter while holding the first and third parameters constant to ascertain an optimized value for the second parameter under particular conditions (with such conditions including the number of layers set at step 70, and the values of the first and third parameters utilized at step 76). The value of the first parameter utilized at step 76 is the optimized value obtained from step 74.

Step 78 of the optimization loop varies the third parameter while holding the first and second parameters constant to ascertain an optimized value for the third parameter under particular conditions (with such conditions including the number of layers set at step 70, and the values of the first and second parameters utilized at step 78). The value of the first parameter utilized at step 78 is the optimized value obtained from step 74, and the value of the second parameter utilized at step 78 is the optimized value obtained from step 76.

The optimizations of the first, second and third parameters may be tied to one another (rather than being independent variables), and accordingly steps 74, 76 and 78 may be repeated multiple times (as indicated by dashed-line 77) until a stable result is obtained for the optimized values of the first, second and third parameters.

The optimization of a parameter may utilize NILS.

Each of the layers is independently optimized for n value, k value and thickness as the layers are subjected to the optimization loop. However, the results obtained for a subsequent layer may impact the optimization of an earlier layer. Accordingly, it may be desired to cycle the various layers multiple times through the optimization loops until stable results are reached for all of the layers.

The number of layers may affect the contrast obtained for a photomask, and accordingly the number of layers may be varied as part of the optimization loop.

The optimization loop creates a dataset which is subsequently translated into a pattern formed on a real photomask (i.e., taped). The taping will provide actual compositions for the layers, with such compositions having extinction coefficients and refractive indices approximating those determined from the optimization loop 75. In some embodiments, it may be desirable to utilize compositions within which one or both of extinction coefficient and refractive index may be readily modified. For instance, some compositions may have extinction coefficient and/or refractive index modifiable across a wide range by including various amounts of dopant or other material within the compositions. Thus, the compositions may be tailored to have the specific n value and k value ascertained from the optimization loop. In an example embodiment, the extinction coefficient of a material may be tailored by including a specific amount of a relatively opaque constituent (for instance, chromium) within an otherwise transparent composition.

The step of taping the pattern onto the photomask is represented by step 80.

Other parameters may be included in the optimization loops of FIGS. 5 and 6 in addition to those specifically described. For instance, the liners of FIG. 3 may be mathematically represented in the modeling of the photomask and optimized relative to one or both of composition and thickness. Further, if the liners comprise multiple layers, each of the layers of the liners may be optimized relative to composition and thickness through representation of the liners in the mathematical construction submitted to the optimization loop, and the number of layers in the liners may also be optimized through representation of the liners in the mathematical construction submitted to the optimization loop. After a dataset corresponding to optimized liners is obtained through utilization of the optimization loop, the dataset may be used to tape out actual liners for photomasks in the steps 60 and 80 of FIGS. 5 and 6.

Figure 7:
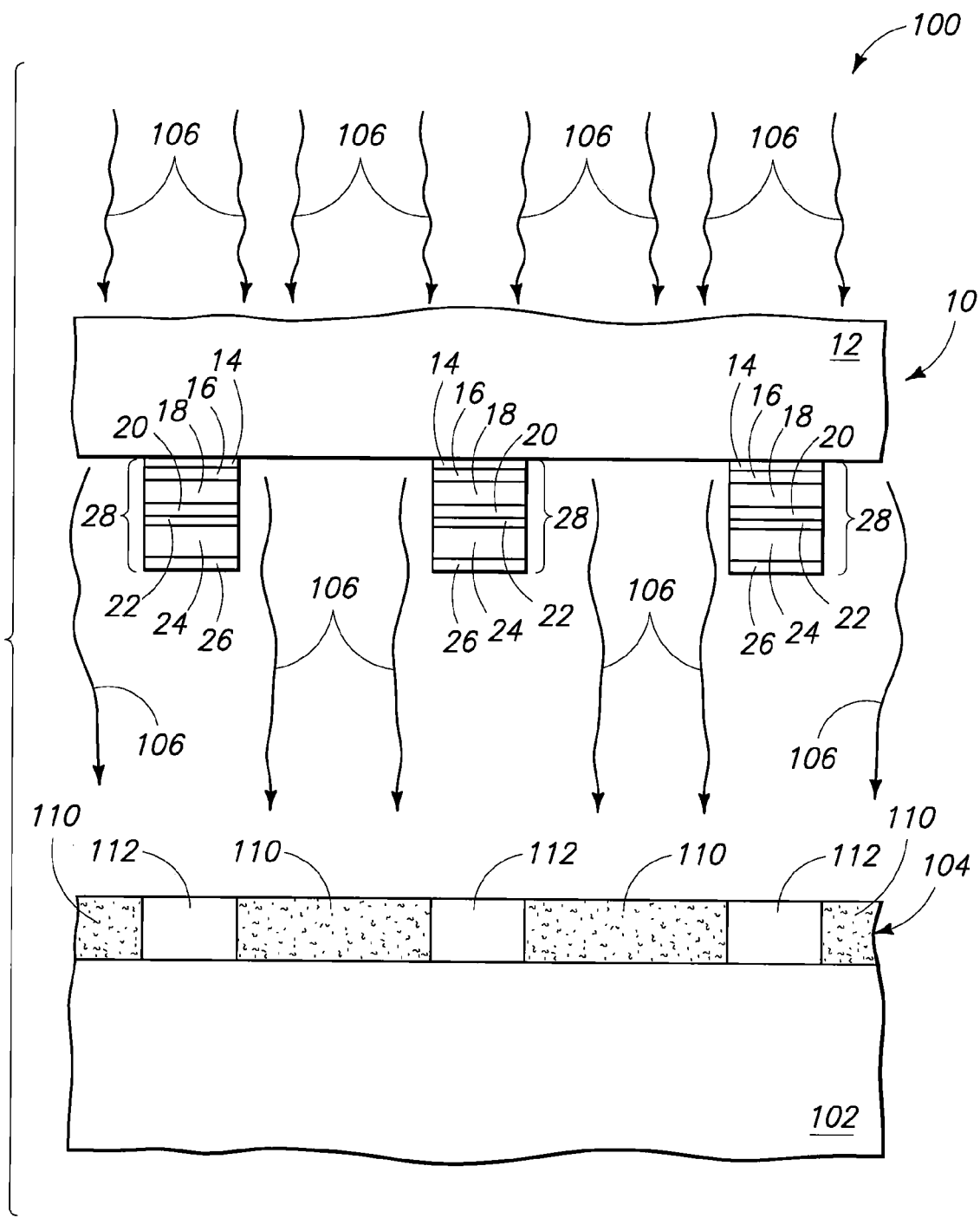
FIG. 7 is a diagrammatic cross-sectional view of a semiconductor wafer fragment being processed with light passing through a reticle in accordance with an example embodiment.

Embodiments may also encompass methods of using one of the above-described photomasks during photolithographic patterning of a substrate. FIG. 7 shows an apparatus 100 comprising a photomask 10 (identical in design to the photomask described above in FIG. 2), and a semiconductor substrate 102 to be photolithographically patterned. The semiconductor substrate is shown to be homogeneous in FIG. 7 for simplicity of illustration, although it may comprise multiple distinct layers. For instance, the semiconductor substrate may comprise monocrystalline silicon having one or more layers associated with integrated circuit fabrication supported thereon.

An imaging layer 104 is over substrate 102. The imaging layer is a layer which is capable of having its solvent solubility changed by exposure to a suitable actinic energy. The imaging layer may, for example, correspond to photoresist and/or various polyimides.

Actinic energy 106 is impinged at the mask 10, and patterned by the mask. The patterned actinic energy impacts imaging layer 104, and forms a pattern of exposed regions 110 and unexposed regions 112 across the imaging layer. In subsequent processing (not shown) solvent may be utilized to selectively remove either the exposed regions or the unexposed regions to thereby pattern layer 104, and the pattern may then be transferred into substrate 102 with one or more suitable etches.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. A method of forming a photomask, comprising:
    defining a photomask construction that has a radiation-patterning topography across a reticle base, the radiation-patterning topography comprising pillars that individually contain at least three distinct layers, and comprising gaps between the pillars; individual layers of the at least three distinct layers each having a characteristic n value, k value and thickness;
    utilizing an algorithm to vary n value, k value and thickness of the layers of the defined photomask construction, and thereby obtain optimized parameters of n value, k value and thickness for each of the layers of the defined construction; and
    constructing a photomask containing at least three distinct actual layers over an actual reticle base, with the actual layers being formed to comprise the optimized parameters obtained from utilizing the algorithm on the defined photomask construction.

2. The method of claim 1 wherein the at least three distinct actual layers primarily comprise only two distinct materials.

3. The method of claim 1 wherein the at least three distinct layers comprise more than two distinct materials.

4. The method of claim 1 wherein the defined construction comprises liners along sidewalls of the pillars, with the liners narrowing gaps between the pillars without eliminating the gaps, and further comprising:
    utilizing the algorithm to vary n value, k value and thickness of the liners layers and thereby obtain optimized parameters of n value, k value and thickness for the liners; and
    including actual liners in the constructed photomask, with the actual liners being formed to comprise the optimized parameters of the liners obtained from utilizing the algorithm on the defined photomask construction.

5. The method of claim 4 wherein the liners comprise a single layer.

6. The method of claim 4 wherein the liners comprise more than one layer.

7. A method of forming a photomask, comprising:
    defining a photomask construction comprising a radiation-patterning topography across a reticle base, the radiation-patterning topography comprising pillars that comprise "q" layers, and comprising gaps between the pillars, where "q" is an integer of greater than or equal to 3; individual layers of the "q" layers each having a characteristic n value, k value and thickness; the n value, k value and thickness being defined as three parameters; said three parameters being a first parameter, second parameter and third parameter;
    utilizing an optimization loop that, for layers 1 to "q", does at least one iteration of the following:
        varies the first parameter while holding the second and third parameters constant to ascertain an optimized value of the first parameter for chosen conditions;
        varies the second parameter while holding the first and third parameters constant to ascertain an optimized value of the second parameter for the chosen conditions, the first parameter being held constant at the optimized value of the first parameter for the chosen conditions while the second parameter is varied; and
        varies the third parameter while holding the first and second parameters constant to ascertain an optimized value of the third parameter, the first and second parameters being held constant at the optimized values of the first and second parameters for the chosen conditions while the third parameter is varied; and
    forming materials over a reticle base to specifications obtained from the optimization loop.

8. The method of claim 7 wherein the number of layers formed over the reticle base is "q".

9. The method of claim 7 wherein the number of layers is varied as part of the optimization loop.

10. A method of forming a photomask, comprising:
    defining a photomask construction comprising a radiation-patterning topography across a reticle base, the radiation-patterning topography comprising pillars that comprise "q" layers, and comprising gaps between the pillars, where "q" is an integer of at least 2; individual layers of the "q" layers each having a characteristic composition and thickness; the composition and thickness being defined as two parameters; said two parameters being a first parameter and a second parameter;
    utilizing an optimization loop that, for layers 1 to "q", does at least one iteration of the following:
        varies the first parameter while holding the second parameter constant to ascertain an optimized value of the first parameter for chosen conditions; and
        varies the second parameter while holding the first parameter constant to ascertain an optimized value of the second parameter for the chosen conditions, the first parameter being held constant at the optimized value of the first parameter for the chosen conditions while the second parameter is varied; and
    forming materials over a reticle base to specifications obtained from the optimization loop.

11. The method of claim 10 wherein the number of layers formed over the reticle base is "q".

12. The method of claim 10 wherein the number of layers is varied as part of the optimization loop.

* * * * *